(12) United States Patent
Kim et al.

(10) Patent No.: US 6,813,288 B2
(45) Date of Patent: Nov. 2, 2004

(54) TUNABLE OPTICAL SIGNAL OSCILLATOR

(75) Inventors: A-jung Kim, Seoul (KR);
Young-kwang Seo, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/106,201

(22) Filed: Mar. 27, 2002

(65) Prior Publication Data

US 2002/0146046 A1 Oct. 10, 2002

(30) Foreign Application Priority Data

Mar. 28, 2001 (KR) ........................................ 2001-16324

(51) Int. Cl.[7] .............................................. H01S 3/10
(52) U.S. Cl. ............................................ 372/20; 372/18
(58) Field of Search .................................... 372/18–30

(56) References Cited

U.S. PATENT DOCUMENTS

| | | | | |
|---|---|---|---|---|
| 4,095,122 A | * | 6/1978 | Damen et al. | ............... 359/326 |
| 4,784,450 A | * | 11/1988 | Jain et al. | ................... 359/332 |
| 5,063,559 A | * | 11/1991 | Marcuse | ...................... 359/127 |
| 5,113,524 A | * | 5/1992 | Hirota et al. | .................. 398/43 |
| 5,386,314 A | * | 1/1995 | Jopson | ......................... 359/326 |
| 5,548,603 A | * | 8/1996 | Calvani et al. | ................ 372/25 |
| 5,778,016 A | * | 7/1998 | Sucha et al. | ................ 372/38.1 |
| 6,282,214 B1 | * | 8/2001 | Goto et al. | .................... 372/20 |
| 6,396,856 B1 | * | 5/2002 | Sucha et al. | .................. 372/25 |
| 6,433,860 B1 | * | 8/2002 | Ohishi | ........................ 356/5.01 |

* cited by examiner

*Primary Examiner*—Minsun Oh Harvey
*Assistant Examiner*—Tuan N. Nguyen
(74) *Attorney, Agent, or Firm*—Burns, Doane, Swecker & Mathis, L.L.P.

(57) ABSTRACT

A tunable optical oscillator that generates optical signals at a band of micro- to millimeter-wave is provided. The tunable optical oscillator includes an electrical signal generator for generating an electrical signal at the predetermined band; a master laser that is driven by the electrical signal, and generates an optical signal having a first frequency; and a slave laser that is driven by an electrical signal, injected into the optical signal generated by the master laser, generates an optical signal having a second frequency, and mixes the received optical signal with the optical signal having a second frequency to be output. The tunable optical oscillator is capable of generating signals over a broadband including micro- to millimeter-wave and beyond, say, from tens of MHz to several THz. The generated signals by the optical oscillator have also frequency tunability over the range of tens of GHz with coarse tuning methods to tens of MHz with fine tuning methods.

20 Claims, 5 Drawing Sheets

TUNABLE OPTICAL SIGNAL OSCILLATOR

Priority is claimed to Patent Application No. 2001-16324 filed in Rep. of Korea on Mar. 28, 2001, herein incorporated by reference.

BACKGROUND OF THE INVENTION

1. Field of the Invention

The present invention relates to a tunable optical oscillator, and more particularly, to a tunable optical oscillator that generates signals at a band of micro- to millimeter-wave.

2. Description of the Related Art

Increasing demands for the mobile Internet services including video and interactive services have resulted in the exhaustion of the available frequency band for wireless communications, and so triggered the development of the 4$^{th}$ generation wireless communication system. As the next generation communication system of the IMT-2000 (International Mobile Telecommunication), the micro/millimeter-wave communication that uses signals at the band of 3 GHz to 3000 Hz is drawing attention for broadband wireless communication.

However, because of its limitation on the transmission distance and need for high-frequency sources, the micro/millimeter-wave communication system requires to be hybrided with the existing wire systems. Low-attenuation, EMI-free optical fiber transmission is considered as the most promising candidate for long-haul transport of the high frequency band wireless signals, and the technology for generating optical micro/millimeter wave is the key technology for the broadband communication system.

Among the system design options for the hybrid optical wireless system, generating and transmitting optical millimeter wave signals has many advantages. While the baseband transmission has a disadvantage of highly complex outdoor base stations with full SDH/SONET compliant equipments, the optical mm-wave transmission system has relatively simple outdoor base stations with compact remote antenna units. Thus, it can reduce loads of many antennas in pico-cell communication networks Moreover, as the high-frequency optical signals are generated at a central station it can be built a centralized system. With control functions at the central station, the channel allocation, hand-over and antenna can be easily controlled, and the number of subscriber that the system can support increases. In addition to the advantage of easy system maintenance, it has transparency to modulation types. Since the generated optical signals are modulated by electric baseband signals, it is flexible to any type of modulation formats. With these advantages, it enables cost-effective and efficient communication and provides flexibility to radio access in the subscriber loop such as mobile LAN or broadband wireless local loop (B-WLL) systems.

In the hybrid fiber radio system, methods for generating optical micro/millimeter-wave signals can be classified according to modulation methods or the number of the light sources.

The conventional methods for generating micro/millimeter-wave signals include a direct modulation method (P. A. Morton, Electron. Lett., Vol. 30, No. 24, p. 2044, 1994), and an external modulation method (U. Gliese, IEEE Trans. Microwave Theory Tech., Vol. 44, No. 10, p. 1716, 1996). However, these methods are costly due to the complexity and cost of electronic circuits and have limitation on the achievable frequency. The methods using one light source include a sideband techniques (G. H. Smith, IEEE Trans. Microwave Theory Tech., Vol. 45, No. 8, p. 1410, 1997), a mode locking laser (T. Kuri, IEEE Trans. Microwave Theory Tech., Vol. 47, No. 5, p. 570, 1999) and a dual mode laser method (D. Wake, IEEE Trans. Microwave Theory Tech., Vol. 43, No. 9, p. 2270, 1995). These methods are not practical, either, in that manufacturing and developing these optical devices is difficult and costly.

In consideration of cost, frequency tunability, and upgradability to multi-channel systems, it is desirable to adopt a multi-source method, that is, a heterodyne method that uses beating between signals from different sources to produce signals of the wanted frequency.

One of the heterodyne methods using injection locking was introduced by L Noel (IEEE Trans. Microwave Theory Tech., Vol. 45, No. 8, p. 1416, 1997). In this method, a continuous wave light from a master laser is injected into a RF-modulated slave laser and locks one of sideband modes of the slave laser. Then, the optical signals of tens of GHz, which corresponds to the difference between the lasing and injected frequencies of the slave laser, was generated by beating between two signals. However, since the power of the sideband modes are relatively low and so the range of the available sideband modes is limited, the maximum achievable frequency with this scheme is limited. It depends on the modulation response of the master and slave lasers.

SUMMARY OF THE INVENTION

To solve the above problems, it is an objective of the present invention to provide an apparatus for generating optical micro/millimeter wave signals with tunability by injection locking of four-wave mixing (FWM) conjugates modes.

To achieve the above objective, there is provided a tunable optical oscillator comprising an electrical signal generator for generating electrical signals at an RF band; a master laser driven by the electrical signals and for generating optical signals of a first frequency; and a slave laser driven by the electrical signals, and for generating optical signals of a second frequency; the apparatus that feeds the signals from the master laser to the slave laser to carry out the four-wave-mixing and injection-locking, and that outputs the resulting signals from the slave laser.

BRIEF DESCRIPTION OF THE DRAWINGS

The above objective and advantages of the present invention will become more apparent by describing in a detail preferred embodiment thereof with the attached drawings in which:

FIG. 2($a$) is a spectrum of the peaks of continuous waves each generated by a master laser and a slave laser of FIG. 1 without connecting an electrical signal generator, and FWM conjugates modes appearing when the continuous waves are interacted with each other;

FIGS. 2($b$) and ($c$) are the spectrum of optical signals each from the master laser and the slave laser when they are driven by the electrical signals at a RF band;

FIG. 2($d$) is a view of the red shift of the lasing frequency $f_{SL}$ of the slave laser due to the injection locking;

FIGS. 3($a$) through ($f$) are spectrums of the outputs of the slave laser detected by an optical spectrum analyzer when the light from the master laser is injected into the slave laser according to the present invention;

DETAILED DESCRIPTION OF THE INVENTION

Figure 1:
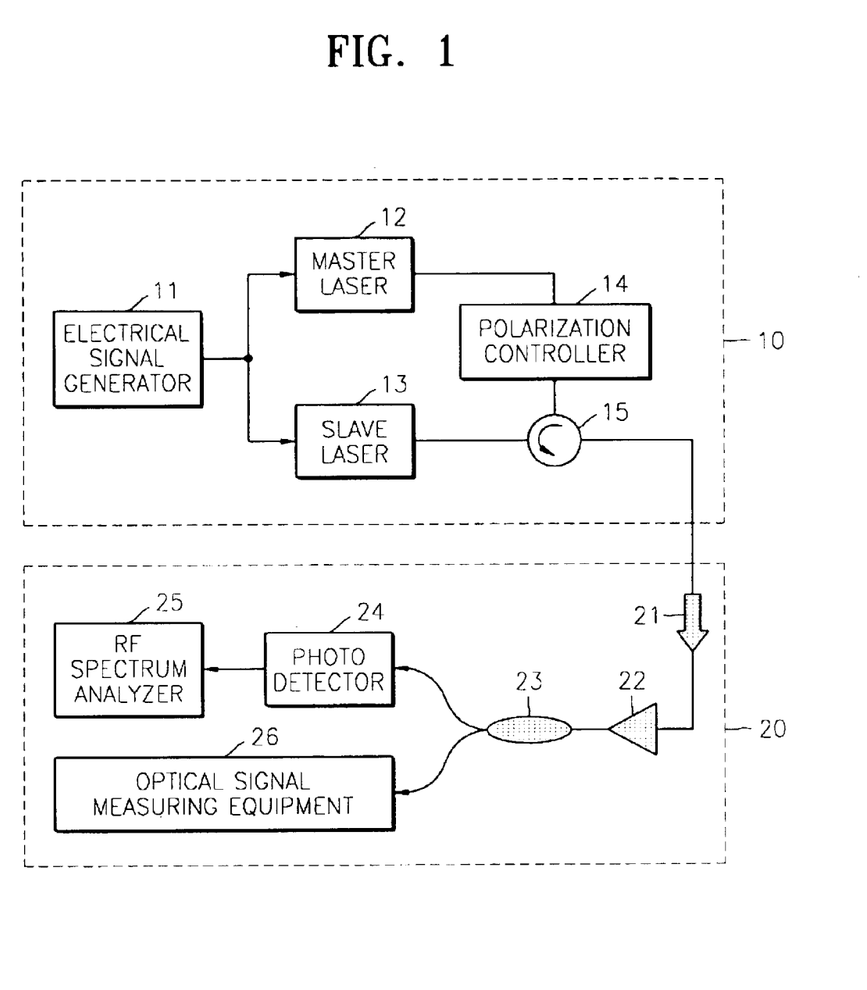
FIG. 1 is a block diagram of a tunable optical oscillator according to the present invention.

FIG. 1 is a block diagram of a tunable optical oscillator according to the present invention. Reference numeral 10 denotes an optical signal oscillating unit. Reference numeral 20 denotes a measuring unit to investigate the spectral characteristics of the light generated by the optical signal oscillating unit 10. The optical signal oscillating unit 10 includes an electrical signal generator 11, a master laser (ML) 12 and a slave laser (SL) 13. Also, an optical signal routing device 15 is positioned between the ML 12 ad the SL 13 to feed signals from the ML 12 into the SL 13 and to output signals from the SL 13. A polarization controller 14 may be installed between the ML 12 and the optical signal routing device 15.

The electrical signal generator 11 supplies an electrical signal at a RF band to drive the ML 12 and the SL 13. Preferably, a radio frequency (RF) modulated signal is used as the electrical signal for communication systems. The ML 12 driven by the electrical signal generates an optical signal. The ML 12 would generate modulated optical signals if it is driven by modulated electrical signals. Preferably, the ML 12 is a distributed-feedback-laser-diode (DFB-LD) that is internally isolated. The optical signal generated by the ML 12 is injected into the SL 13 via the optical signal routing device 15 such as an optical circulator or an optical coupler with optical isolators. The optical signal generated by the ML 12 may be passed through the polarization controller 14 that controls the polarization of the optical signal to reduce the attenuation, and then be input to the optical signal routing device 15. The SL 13 is a DFB-LD or a Fabri-Parot LD (FD-LD) without an internal isolator. In order to induce non-degenerated four-wave mixing (FWM), the lasing frequency $f_{ML}$ of the ML 12 must be out of the locking range of the SL 13. Preferably, $f_{ML}$ is higher than the lasing frequency $f_{SL}$ of the SL 13, and sufficiently detuned to cause down-conversion with the frequency $f_{SL}$ of the SL 13. When one generates continuous wave by adjusting the bias current and operating temperature of the ML 12 and injects it into the SL13, non-degenerated FWM conjugates with various frequencies of difference between and sum of $f_{ML}$ and $f_{SL}$ can be also generated due to the non-linear characteristics of the semiconductor laser. The photon density in a cavity of the SL 13 is oscillated with a frequency of a difference between lasing frequencies of the ML 12 and the SL 13. Beat signals between the non-degenerated FWM conjugates signals as well as peak signals of the ML 12 and the SL 13 are detected at a square-law-governed direct detector. The measuring unit 20 includes an optical isolator 21, an optical amplifier 22, a coupler 23, a photo detector 24, an RF spectrum analyzer 25 and an optical signal measuring equipment 26.

The optical isolator 21 prevents the optical signal output from flowing backward into the optical routing device 15. The optical amplifier 22 amplifies the optical signal passed through the optical isolator 21, and the optical coupler 23 divides the amplified optical signal into two optical signals. The photo detector 24 converts one of the divided optical signals into an electrical signal. The bandwidth of the photo detector 24 must be greater than the generated micro/mm-wave frequency. The RF spectrum analyzer 25 shows the RF spectrum of output signals from the photo detector. The other one of the divided optical signals may be measured optically by the optical signal measuring equipment 26. Preferably, an optical spectrum analyzer or a Fabri-Perot Interferometer having a small free spectrum range can be used as the optical signal measuring equipment 26. The measuring unit 20, which is dispensable for the present invention, is presented here for explaining the experimental result.

The electrical signal generator 11 modulates the ML 12 and the SL13 with frequency modulation generating sideband signals around each lasing frequency, and stabilizes optical beat signals between these side modes. The detailed explanation is as follows. The square-law direct detector detects not only peak signals from the ML 12 and the SL 13, and FWM conjugate mode signals, but also beat signals of these signals. However, since the sources of the beat signals are different and so lack coherency, the generated beat signals are unstable and impure. To reduce phase noise and stabilize the beat signals, the ML 12 and the SL 13 are connected to the electrical signal generator 11, preferably, an RF signal source, via a 3 dB-coupler (not shown). The RF signal source supplies electrically direct-modulated or unmodulated signals to the ML 12 and the SL 13. In the ML 12, sideband modes are generated around the lasing frequency by the RF signal source with frequency modulation. The sideband modes are injected into a cavity of the SL 13 and induce locking of SL 13 output signals. As a result, non-degenerated conjugate modes as well as the fundamental mode of the SL 13 are shifted to be overlapped one of sideband modes of the ML12 by locking effect and the output signals become of less fluctuation and phase noise.

Figure 2:
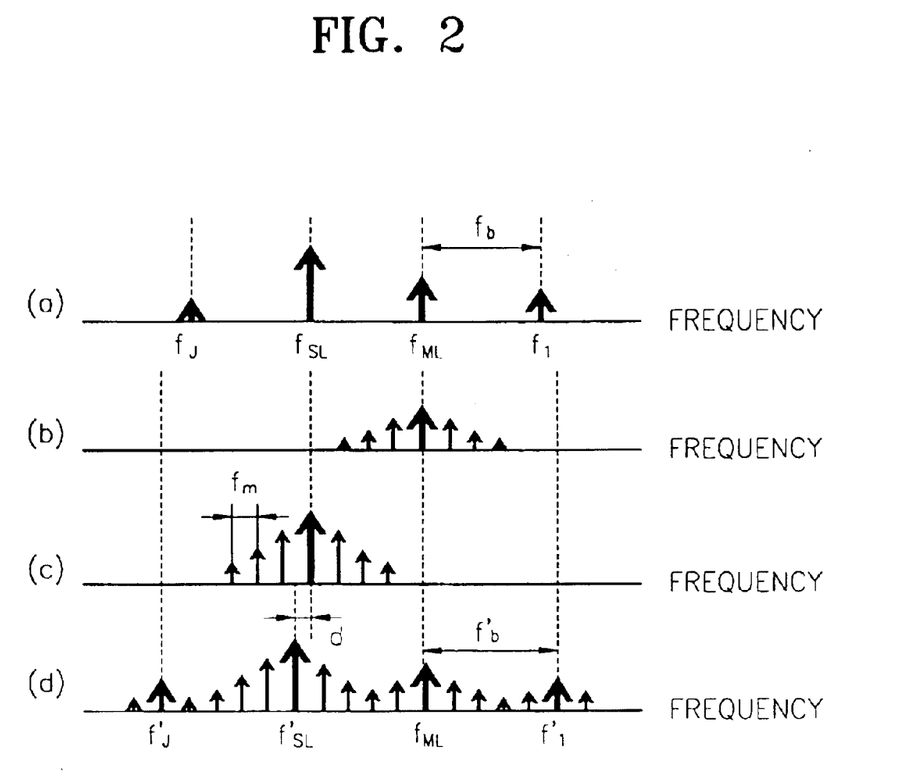

FIG. 2(a) shows a spectrum of the peaks of continuous waves each generated by the ML 12 and the SL 13 and FWM conjugates modes appearing when the continuous waves are interacted with each other. The separation of the lasing frequencies of the ML 12 and the SL 13 does not allow injection locking initially. $f_I$ and $f_J$ are FWM conjugate frequencies.

$f_b$ that is the interval between $f_I$ and $f_{ML}$ is the same as the interval between $f_J$ and $f_{SL}$ and the interval between the lasing frequencies of the ML 12 and the SL 13 The frequency $f_{SL}$ of an optical signal generated by the SL 13 shifts to a lower frequency due to a reduction in the carrier density of the SL 13 when the laser light generated by the ML 12 is injected into the cavity of the SL 13, the effect of which is called 'red shift'. Since the laser light injected into the SL 13 serves as a pump signal for FWM, not as a master laser for locking, the beat signals generated by the ML 12 and the SL 13 have serious fluctuations and phase noise because of lack of coherency. In experiments, the fluctuation is in the order of tens of MHz for the beat signals of tens of GHz.

FIGS. 2(b) and (c) are the spectrum of optical signals generated by the ML 12 and the SL 13, respectively, when they are driven by the electrical signals at a RF band. In direct modulation of RF signals, frequency modulation as well as intensity modulation occurs only to cause sideband modes appearing around the lasing frequencies of the ML 12 and the SL 13 at an interval of RF modulation frequency $f_m$.

FIG. 2(d) shows the red shift that appears in the frequency $f_{SL}$ generated by the SL 13 due to injection locking. When the signals of the ML 12 are injected to the SL 13, one of the sideband modes of the SL 13 is coupled with and locked to one of those of the ML. Accordingly, $f_{SL}$ is shifted to $f_{SL}'$ which is located at a multiple of RF-modulation frequency $f_m$ from $f_{ML}$, and then the output signals from the SL 13 are locked. The injection locking is achieved when the sideband modes of the ML 12, which is injected to the SL 13, are superposed within the locking range and coupled with some of the sideband modes of the SL 13. With the injection locking of the side band modes of $f_{ML}$, $f_{SL}$ is shifted to $f_{SL}'$, the difference between which and the master laser frequency $f_{ML}$ is a multiple of RF-modulation frequency $f_m$. The more increased the power Pm of the RF-modulation signal is, the further red-shifted $f_{SL}$ and its side modes are, and the stronger coupling and locking of the sideband modes SL 13 with the ones of the ML 12 are.

As $f_{SL}$ is shifted to $f_{SL}'$, the FWM conjugate mode frequencies $f_I$ and $f_J$ are shifted to $f_I'$ and $f_J'$, respectively, and then locked with each other. Accordingly, the difference between the modes of ML 12/SL 13 and its adjacent FWM conjugate mode is adjusted from $f_b$ to $f_b'$ that is a multiple of the RF-modulation frequency $f_m$. All the FWM conjugate modes are locked with one another, and can generate stable beat signals with reduced phase noise.

Figure 3:
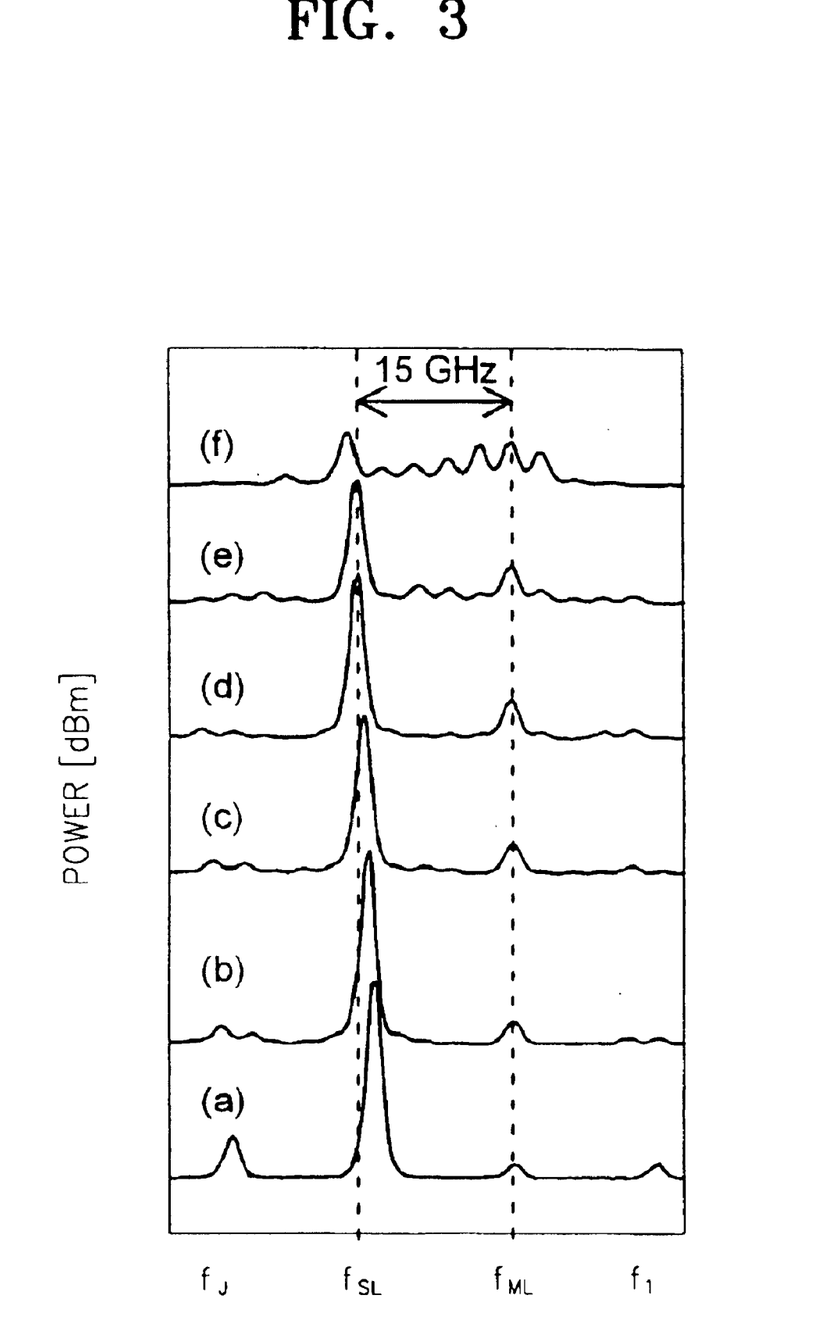

FIGS. 3(a) through (f) and FIGS. 4(a) through (f) are spectrum of the outputs from the SL 13 which are measured with an optical spectrum analyzer (not shown), and an RF spectrum analyzer (not shown), respectively, when the laser light from the ML 12 is injected into the SL 13 according to the present invention. In detail, FIG. 3(a) and FIG. 4(a) are the output spectrum from the SL 13 where no RF-modulated signal is supplied to the SL13. FIGS. 3(b) through (f) and FIGS. 4(b) through (f) are the output spectrum from the SL 13 when the RF-modulated signals are supplied to the SL13 with the power $P_m$ of (b) 5 dBm, (c) 8 dBm, (d) 10 dBm, (e) 12 dBm and (f) 16 dBm, respectively.

As shown in FIG. 3(a) and FIG. 4(a), when the RF-modulating source is not connected to the SL 13, the outputs are the ML 12/SL 13 signals of frequencies $f_{SL}$, $f_{ML}$, their FWM conjugate mode signals, and the beat signals of a frequency of 13.8 GHz.

If the ML 12 and SL 13 are both directly modulated with the RF source of a frequency $f_m$ of 3 GHz, the frequency $f_{SL}$ is shifted to a lower frequency as shown in FIGS. 3(b) and (c). As the power Pm of the RF-modulating signal increases, $f_{SL}$ is further shifted to the lower frequency. This red shift of the lasing frequency of the SL 13 can also be shown in FIGS. 4(b) and (c), in that the frequency of the beat signal increases as the power Pm increases.

Figure 4:
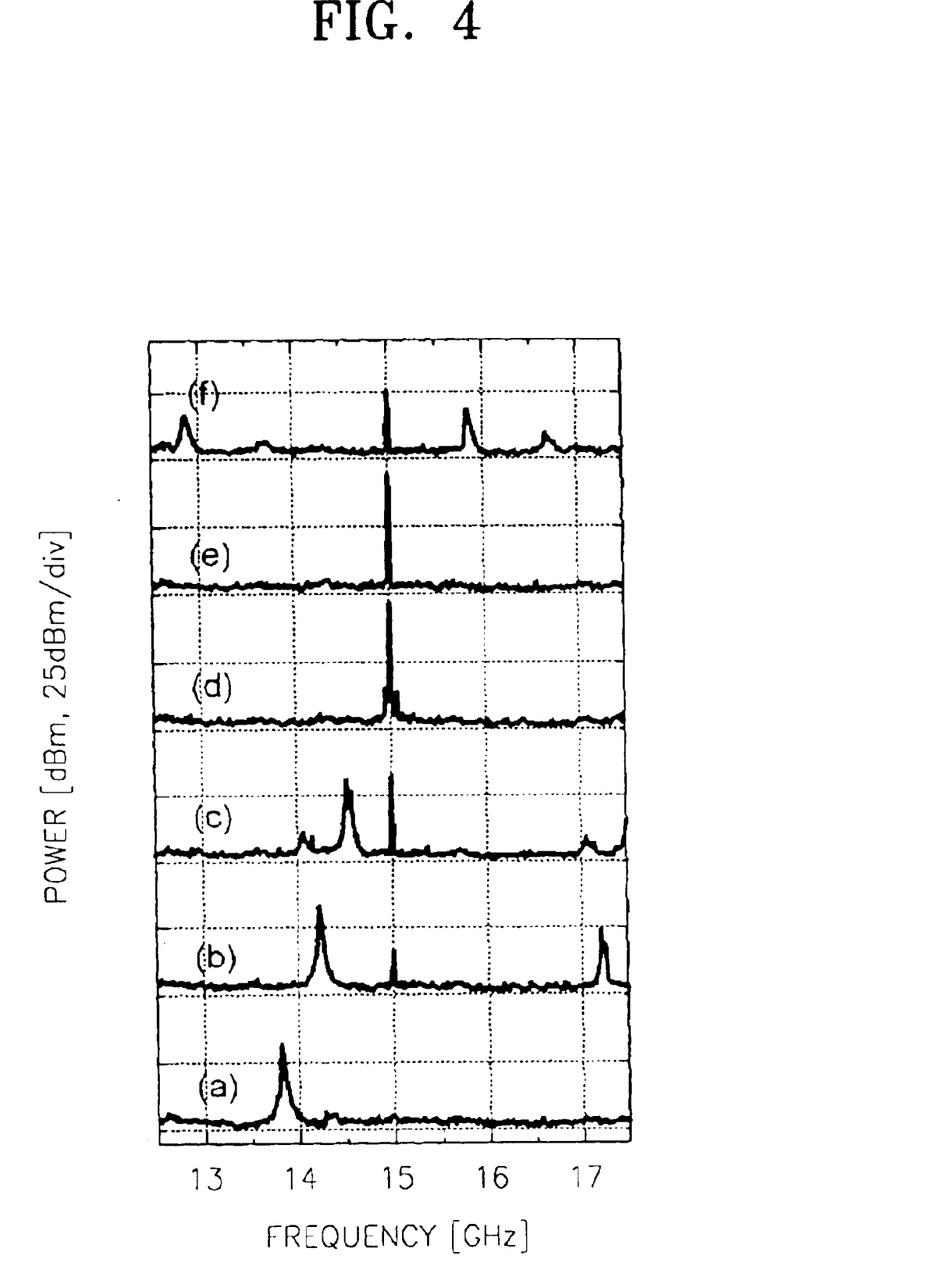
FIGS. 4(a) through (f) are spectrums of the outputs of the slave laser measured by an RF spectrum analyzer when the light from the master laser is injected into the slave laser according to the present invention.

As can be seen in FIG. 4, because of the electrical RF modulation, additional modes are generated and measured at the intervals $f_m$ from the main beat signal (of a frequency of a difference between the ML 12 and the SL 13 frequencies) and a multiple of the modulated frequency, which are due to the higher order harmonics of the modulated signal. The additional mode shown in FIGS. 4(b), (c) and (f) is not superposed on the main beat signal mode, meaning that the main beat signal is not locked to the modulated signal and the other modes are just the higher order harmonics, that is, a multiple of $f_m$.

Peripheral modes around the main beat signal are shown in FIGS. 4(c) and (f), due to the back reflection by the surface of the optical fiber pigtail of the SL 13 having no internal isolator.

As the power Pm increases, the sideband modes of the SL13 are red-shifted and locked to those of the ML12. Once locking is achieved, $f_{SL}$ is fixed at the spectral position 15 GHz (a multiple of $f_M$) off from $f_{ML}$ as shown in FIGS. 3(d) and (e).

In FIGS. 4(d) and (e), the beat signal generated within the locking range has much less phase noise and no peripheral modes around it. In the case of Pm=12 dBm (FIG. 4(e)), the phase noise of the RF signal is −96 dBc/Hz at an offset frequency of 100 kHz from 15 GHz. In addition, while the line width of the unlocked signal in FIG. 4(a) is about 4 MHz, that of the locked signal is limited mainly by the resolution of the RF spectrum analyzer 25. Accordingly, it is noted that the present invention can also contribute to reducing line width of micro/millimeter wave band signals. As shown in FIGS. 4(d) and (e), the power of the beat signal increases remarkably, which means that the output signal results from locking. As long as the sideband modes of the SL 13 are locked, the frequency $f_{SL}$ is not further shifted with the increased Pm. In the experiment, the locking behavior in the SL 13 was maintained over a range of 10 dBm<$P_m$<13.5 dBm. But the locking condition was broken and the SL got further red-shifted when the power $P_m$ was greater than 13.5 dBm, as shown in FIG. 3(f) and FIG. 4(f).

Figure 5:
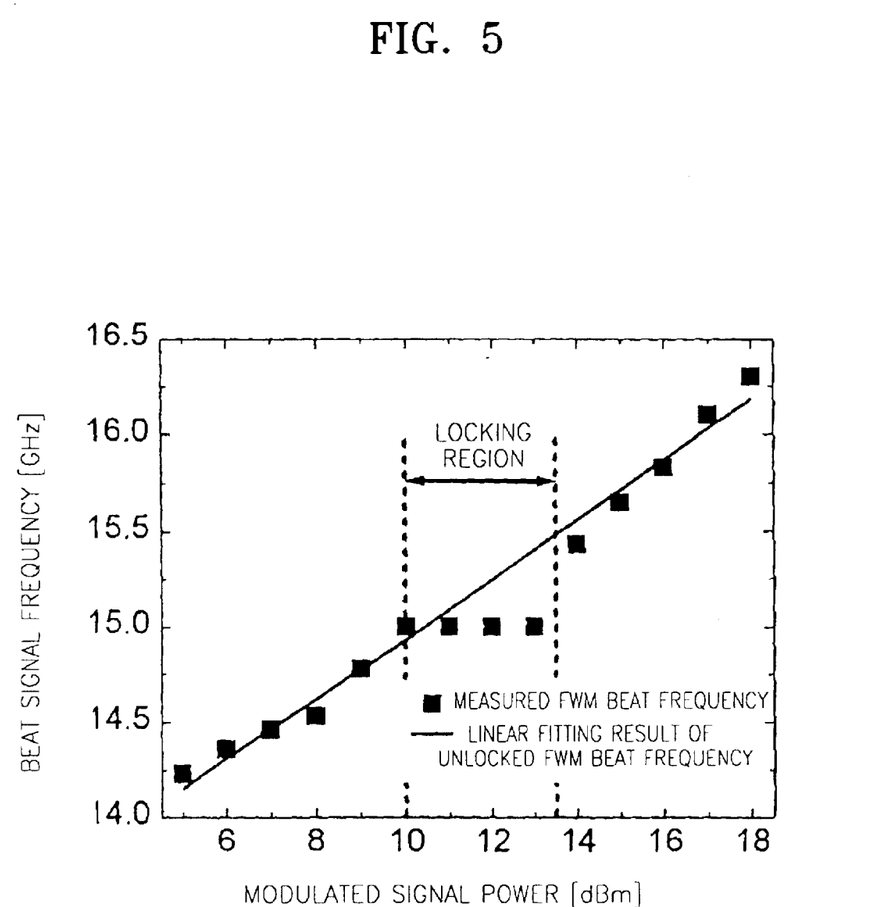
FIG. 5 is a graph of the frequency of beating signals detected by a photo detector versus the power of the electrical RF signals connected to the master and slave laser.

FIG. 5 shows the relationship between the frequency of the output beat signal and the power of the electrical signal $P_m$. The squares denote the generated beat signal frequency, and the solid line corresponds to the linear fitting of the beat frequency between two modes without consideration of locking effects. When the sideband modes of the SL 13 are locked over the locking region, a stable beat signal of 15 GHz without frequency fluctuation can be generated. Also, the frequency of the beat signal monotonically increases with the power $P_m$ at a slope of 150 MHz/dB when the sideband signals of the SL 13 are not locked. As a result, it is possible to generate stable micro/millimeter wave band signals having less phase noise over a locking region of Pm of 10~13.5 dBm. Also, signals of 30, 45 and 60 GHz can be generated by beat signals between the FWM conjugates. Thus, the achievable frequency range of the generated signals can be even more widened according to the present invention.

One of advantages of the oscillator according to the present invention is frequency tunability of generated signals. The frequency of the output beat signal can be varied by changing frequencies of the FWM conjugate modes. This can be done by changing the lasing frequencies of the ML 12 or SL 13, which are controlled by adjusting a bias current or an operating temperature of the laser. Since the tuning range with this method is wide, this is suitable for the coarse tuning.

In other methods, the frequencies of the generated signals can be also tuned by adjusting the modulation frequency of electrical RF signal. If the modulating frequency of the electric signal is varied, the frequencies of the sideband modes of the ML 13 directly modulated by the electric signal varies. These sideband modes lock the fundamental mode and sideband modes of the SL13 and those of FWM conjugate modes, and thus vary their frequencies. Therefore, the generated beat signals are tunable by adjusting the modulation frequency. This method is available in fine tuning with resolution of tens of MHz as the locking is relatively easy.

Therefore, it is possible to adjust the frequencies of the generated signal over the range of tens of GHz to tens of MHz by combining the above methods.

As described above, a tunable optical signal oscillator according to the present invention is able to generate signals of micro- to millimeter-wave and beyond over a broadband frequency region from tens of MHz to several THz. That is, since the locking and beating between the FWM conjugate modes are used to broaden the range of available harmonics modes, it can realize a high-frequency oscillator having no limit, in principle, on the achievable frequency. The method according to the present invention is applicable to realize optical devices such as a semiconductor laser and an optical modulator in an ultra-high speed optical communication system or the next generation wireless system. With the optical oscillator according to the present invention, not only the achievable frequency range is very wide, but also the frequency is tunable. It can realize an optical source with which both the coarse tuning of several GHz and the fine tuning of tens of MHz are possible by adjusting electric current or operating temperature of a laser diode, and the frequency of electric modulation signal. It would provide enhanced flexibility and scalability to hybrid-fiber-wireless systems with broadband wireless communication systems such as broadband-wireless local loop (B-WLL) and indoor wireless LAN and its application areas are wide. Also, significantly reducing phase noise and frequency fluctuation of the signal, it can realize a stabilized light source. Further, communication quality and performance is enhanced as it improves nonlinearity of the generated signal, in that a third order inter-modulation distortion (IMD) decreases and a spunous-free dynamic range (SFDR) increases with the oscillator according to the present invention. In addition, the chirp of a light source can be reduced, and so transmission dispersion of the signal can be reduced which results in less degradation in signal transmission.

In case that the light source of the present invention is employed as a signal transmitter in a central station in a hybrid-fiber-wireless system, no mixers and local oscillators in a remote base station are required to up-convert to a carrier frequency band and the load of antennae can be lessened. It thereby contributes to slimming the size of remote base stations or mobile terminal equipments and to building a cost-effective system. With such a centralized system, control functions and equipments for antennae can be located in the central station and maintenance of antennae as well as control of channel allocation and hand-over becomes easy. The system with the method according to the present invention has signal-format-transparency and is flexible for modulation types of transmitted signal.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A tunable optical oscillator comprising:
   an electrical signal generator for generating an electrical signal at a predetermined band;
   a master laser modulated by the electrical signal, the master laser for generating an optical signal of a first frequency;
   a slave laser modulated by the electrical signal for generating an optical signal of a second frequency, and being injected into the optical signal generated by the master laser, the slave laser for mixing the received optical signal with the optical signal of the second frequency, and for outputting the optical signals; and
   means for feeding signals from the master laser to the slave laser to carry out the four-wave-mixing and injection-locking and for outputting the resulting signals from the slave laser,
   wherein peak modes of both the master laser and the slave laser are out of locking range.

2. The tunable optical oscillator of claim 1, wherein the electrical signal generator is an RF modulator that generates an RF-modulated electrical signal.

3. The tunable optical oscillator of claim 2, wherein the master laser generates the first frequency optical signal and sideband-mode optical signals generated around a lasing frequency of the first frequency optical signal.

4. The tunable optical oscillator of claim 1, wherein the master laser is a distributed feedback laser diode or Fabri-Perot laser diode that is internally isolated.

5. The tunable optical oscillator of claim 2, wherein the slave laser generates the second frequency optical signal, and sideband-mode optical signals generated around a lasing frequency of the second frequency optical signal.

6. The tunable optical oscillator of claim 1, wherein the slave laser is a distributed feedback laser diode or a Fabri-Perot laser diode that is not internally isolated.

7. The tunable optical oscillator of claim 6, wherein the slave laser generates the optical signal whose frequency is out of the locking range of the master laser, and produces four wave mixing signals.

8. The tunable optical oscillator of claim 1, wherein the master laser generates the optical signal whose frequencies are higher than the frequencies of the optical signal generated by the slave laser.

9. The tunable optical oscillator of claim 1 further comprising an optical signal routing device positioned between the master laser and the slave laser, the optical signal routing device for transferring the optical signal generated by the master laser to the slaver laser, and for transferring the optical signal generated by the slave laser to the outside.

10. The tunable optical oscillator of claim 9, further comprising a polarization controller positioned between the master laser and the optical signal routing device, the polarization controller for controlling the polarization of the optical signal generated by the master laser.

11. The tunable optical oscillator of claim 3, wherein the master laser is a distributed feedback laser diode or Fabri-Perot laser diode that is internally isolated.

12. The tunable optical oscillator of claim 5, wherein the slave laser is a distributed feedback laser diode or a Fabri-Perot laser diode that is not internally isolated.

13. The tunable optical oscillator of claim 7, wherein the master laser generates the optical signal whose frequencies are higher than the frequencies of the optical signal generated by the slave laser.

14. A tunable optical oscillator comprising:
   an electrical signal generator for generating an electrical signal at a predetermined band;
   a master laser modulated by the electrical signal generated by the electrical signal generator and generating an optical signal of a first frequency;
   a slave laser, modulated by the electrical signal generated by the electrical signal generator and generating an optical signal of a second frequency, wherein said slave laser receives said optical signal of a first frequency from said master laser and mixes the receiving optical signal of the first frequency with said optical signal of the second frequency, and outputs optical signals of various frequencies; and
   an optical routing device for routing said optical signal of a first frequency from the master laser to the slave laser, and for routing said optical signals of various frequencies to an output,
   wherein peak modes of both the master laser and the slave laser are out of locking range.

15. The tunable optical oscillator of claim 14, wherein the electrical signal generator is an RF modulator that generates an RF-modulated electrical signal.

16. The tunable optical oscillator of claim 14, wherein the master laser generates the first frequency optical signal and sideband-mode optical signals generated around a lasing frequency of the first frequency optical signal.

17. The tunable optical oscillator of claim 14, wherein the master laser is a distributed feedback laser diode or Fabri-Perot laser diode that is internally isolated.

18. The tunable optical oscillator of claim 14, wherein the slave laser generates the second frequency optical signal, and sideband-mode optical signals generated around a lasing frequency of the second frequency optical signal.

19. The tunable optical oscillator of claim 14, wherein the slave laser is a distributed feedback laser diode or a Fabri-Perot laser diode that is not internally isolated.

20. The tunable optical oscillator of claim 19, wherein the slave laser generates the optical signal whose frequency is out of the locking range of the master laser, and produces four wave mixing signals.

* * * * *